United States Patent
Wakaki

(10) Patent No.: US 10,727,385 B2
(45) Date of Patent: Jul. 28, 2020

(54) LIGHT EMITTING DEVICE, LIGHT EMITTING ELEMENT AND METHOD FOR MANUFACTURING THE LIGHT EMITTING ELEMENT

(71) Applicant: NICHIA CORPORATION, Anan-shi, Tokushima (JP)

(72) Inventor: Ryosuke Wakaki, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 16/285,624

(22) Filed: Feb. 26, 2019

(65) Prior Publication Data

US 2019/0288169 A1    Sep. 19, 2019

(30) Foreign Application Priority Data

Mar. 15, 2018 (JP) ................. 2018-048218

(51) Int. Cl.
*H01L 33/62* (2010.01)
*H01L 33/32* (2010.01)
*H01L 33/52* (2010.01)
*H01L 33/38* (2010.01)

(52) U.S. Cl.
CPC .............. *H01L 33/62* (2013.01); *H01L 33/32* (2013.01); *H01L 33/38* (2013.01); *H01L 33/52* (2013.01); *H01L 2933/0066* (2013.01)

(58) Field of Classification Search
CPC ......... H01L 33/32; H01L 33/38; H01L 33/52; H01L 33/62
USPC ........................................................ 257/99
See application file for complete search history.

(56) References Cited

U.S. PATENT DOCUMENTS

| 9,865,775 B2 * | 1/2018 | Suh, II ................ H01L 33/24 |
| 2016/0149104 A1 | 5/2016 | Bergmann et al. |
| 2016/0300988 A1 | 10/2016 | Oh et al. |

FOREIGN PATENT DOCUMENTS

| JP | 6-349892 A | 12/1994 |
| JP | 9-116249 A | 5/1997 |
| JP | 2000-260803 A | 9/2000 |
| JP | 2005-197488 A | 7/2005 |
| JP | 2005-347678 A | 12/2005 |
| JP | 2006-012950 A | 1/2006 |
| JP | 2013-131515 A | 7/2013 |
| JP | 2017-536700 A | 12/2017 |
| WO | WO 2012/10203 A1 | 8/2012 |

* cited by examiner

*Primary Examiner* — Monica D Harrison
(74) *Attorney, Agent, or Firm* — Birch Stewart Kolasch & Birch LLP

(57) ABSTRACT

According to one embodiment, a light emitting device includes a first lead, a light emitting element, and a first bonding member. The light emitting element includes a semiconductor stacked body and a first electrode. The semiconductor stacked body includes a light emitting layer. The first electrode is below the semiconductor stacked body. The first bonding member electrically connects the first lead and the first electrode. A lower surface of the first electrode includes a first protrusion, a second protrusion, and a first depression. The first depression is located between the first and second protrusions. The first protrusion has a first side surface. The second protrusion has a second side surface facing the first side surface. The first bonding member contacts at least a part of the first side surface. At least a part of the second side surface is separated from the first bonding member.

16 Claims, 7 Drawing Sheets

LIGHT EMITTING DEVICE, LIGHT EMITTING ELEMENT AND METHOD FOR MANUFACTURING THE LIGHT EMITTING ELEMENT

CROSS-REFERENCE TO RELATED APPLICATIONS

This application is based upon and claims the benefit of priority from Japanese Patent Application No. 2018-048218, filed on Mar. 15, 2018; the entire contents of which are incorporated herein by reference.

FIELD

Embodiments described herein relate generally to a light emitting device, a light emitting element and a method for manufacturing the light emitting element.

BACKGROUND

In a light emitting device, a light emitting element is mounted on a package having a lead. Reliability of the light emitting device is desired to be improved.

SUMMARY

According to one embodiment, a light emitting device includes a first lead, a light emitting element, and a first bonding member. The light emitting element includes a semiconductor stacked body and a first electrode. The semiconductor stacked body includes a light emitting layer. The first electrode is below the semiconductor stacked body. The first bonding member electrically connects the first lead and the first electrode. A lower surface of the first electrode includes a first protrusion, a second protrusion, and a first depression. The first depression is located between the first protrusion and the second protrusion. A first height of the first protrusion is higher than a second height of the second protrusion. The first protrusion has a first side surface. The second protrusion has a second side surface facing the first side surface. The first bonding member contacts at least a part of the first side surface. At least a part of the second side surface is separated from the first bonding member.

According to another embodiment, a light emitting element includes a semiconductor stacked body including a light emitting layer and a first electrode below the semiconductor stacked body. A lower surface of the first electrode includes a first protrusion, a second protrusion, and a first depression. The first depression is located between the first protrusion and the a second protrusion. A first height of the first protrusion is higher than a second height of the second protrusion. A width of the first depression along a direction from the first protrusion toward the second protrusion is not less than 5 μm.

According to another embodiment, a method is disclosed for manufacturing a light emitting element. The method can include preparing a first structure body including a semiconductor stacked body and a base metal part, the base metal part being on a lower surface of the semiconductor stacked body. The method can include forming a first resist on the base metal part, the resist exposing a first portion of the base metal part, and forming a first metal part on the first portion, the first metal part having a first height. Additionally, the method can include forming a second resist on the base metal part, the second resist exposing a second portion located at a position separating from the first portion of the base metal part, and forming a second metal part on the second portion, the second metal part having a second height higher than the first height.

According to another embodiment, a method is disclosed for manufacturing a light emitting element. The method can include preparing a first structure body including a semiconductor stacked body and a base metal part, the base metal part being on a lower surface of the semiconductor stacked body. The method can include forming a first resist on the base metal part, the first resist exposing a first portion of the base metal part and a second portion separating from the first portion, and forming a first metal part on the first portion and the second portion. Additionally, the method can include forming a second resist on the base metal part, the second resist covering a part of the first metal part formed on the first portion and exposing another part of the first metal part formed on the second portion, and forming a second metal part on the other part of the first metal part formed on the second portion.

DETAILED DESCRIPTION

Figure 1:
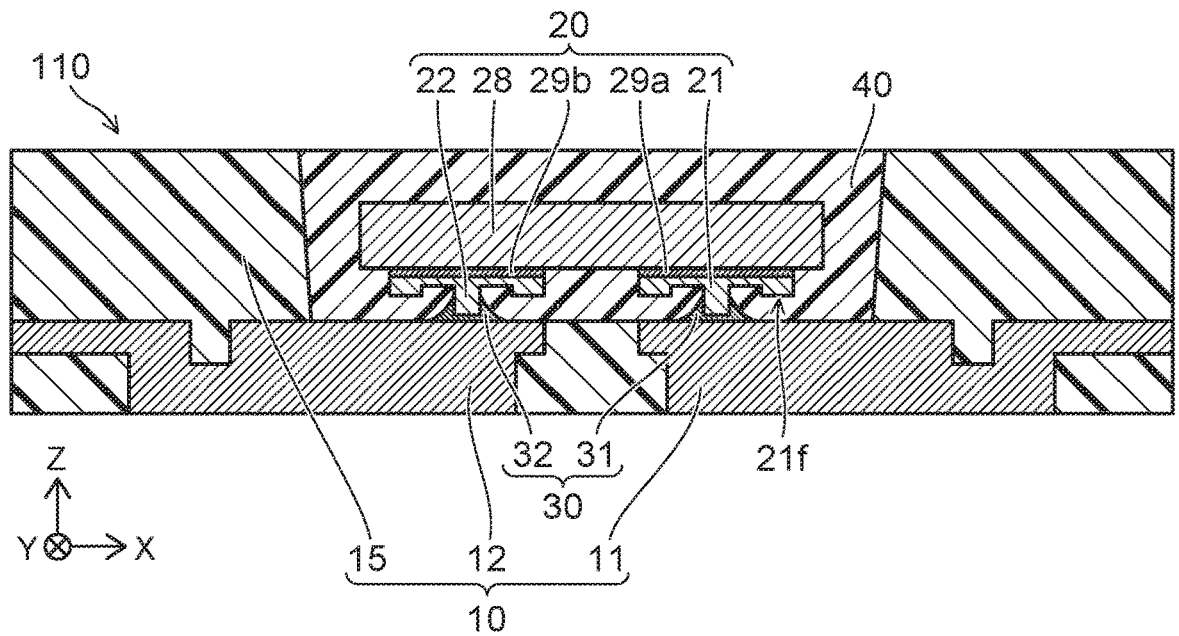
FIG. 1 is a schematic cross sectional view illustrating a light emitting device according to a first embodiment.

Various embodiments will be described hereinafter with reference to the accompanying drawings. In this description, "a first embodiment" refers to a light emitting device, including variations thereof, and "a second embodiment" refers to a method of manufacturing a light emitting element, including variations thereof, according to aspects of the present invention.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic view illustrating a light emitting device according to a first embodiment.

As shown in FIG. 1, a light emitting device 110 according to the embodiment includes a package 10, a light emitting element 20 (for example, LED etc.), and a bonding member 30 (for example, solder etc.). In FIG. 1, electrodes etc. of the light emitting element 20 are omitted. The package 10 includes a lead including a first lead 11 and a second lead 12, and an insulating part 15. An upper surface of the lead part is exposed from the insulating part 15 at a bottom surface of a depression formed of the insulating part 15 (for example, a molded body such as a resin). The light emitting element 20 is placed on the lead part. A sealing member 40 is provided in the depression and the light emitting element 20 is sealed by the sealing member 40 in the light emitting device 110 shown in FIG. 1.

The light emitting element 20 includes a semiconductor stacked body 28, a first electrode 21, and a second electrode 22. The first electrode 21 and the second electrode 22 are located between the semiconductor stacked body 28 and the lead part. On the other hand, the bonding member 30 includes a first bonding member 31 and a second bonding member 32. The first bonding member 31 electrically connects the first electrode 21 and the first lead 11. The second bonding member 32 electrically connects the second electrode 22 and the second lead 12.

The first electrode 21 and the second electrode 22 are below the semiconductor stacked body 28. In the specification, a direction from the lead part (for example, the first lead part 11) toward the electrode (for example, the first electrode 21) is taken as "upward direction" (+Z direction), and the opposite direction is taken as "downward direction" (−Z direction). The Z-axis direction corresponds to a height direction. One direction perpendicular to the Z-axis direction is taken as the X-axis direction. A direction perpendicular to the Z-axis direction and the X-axis direction is taken as the Y-axis direction.

A first pad electrode 29a is provided between the semiconductor stacked body 28 and the first electrode 21 in the light emitting device 110 shown in FIG. 1. Similarly, a second pad electrode 29b is provided between the semiconductor stacked body 28 and the second electrode 22.

A voltage is applied between the first lead 11 and the second lead 12 in the light emitting device 110. A current is supplied to the light emitting element 20 via these leads, and light is emitted from a light emitting layer included in the semiconductor stacked body 28 of the light emitting element 20. The sealing member 40 may include, for example, a wavelength conversion material (for example, phosphor particle etc.). A wavelength of the light emitted from the light emitting layer is converted, emitting light of the light emitting element 20 and emitting light of the wavelength conversion material are mixed, and light of any color (for example, white etc.) is obtained.

The first electrode 21 has a lower surface 21f. The lower surface 21f is a surface facing the first lead 11. An unevenness is provided on the lower surface 21f as described later in the embodiment.

Hereinafter, an example of the light emitting element 20 is firstly described.

Figure 2:
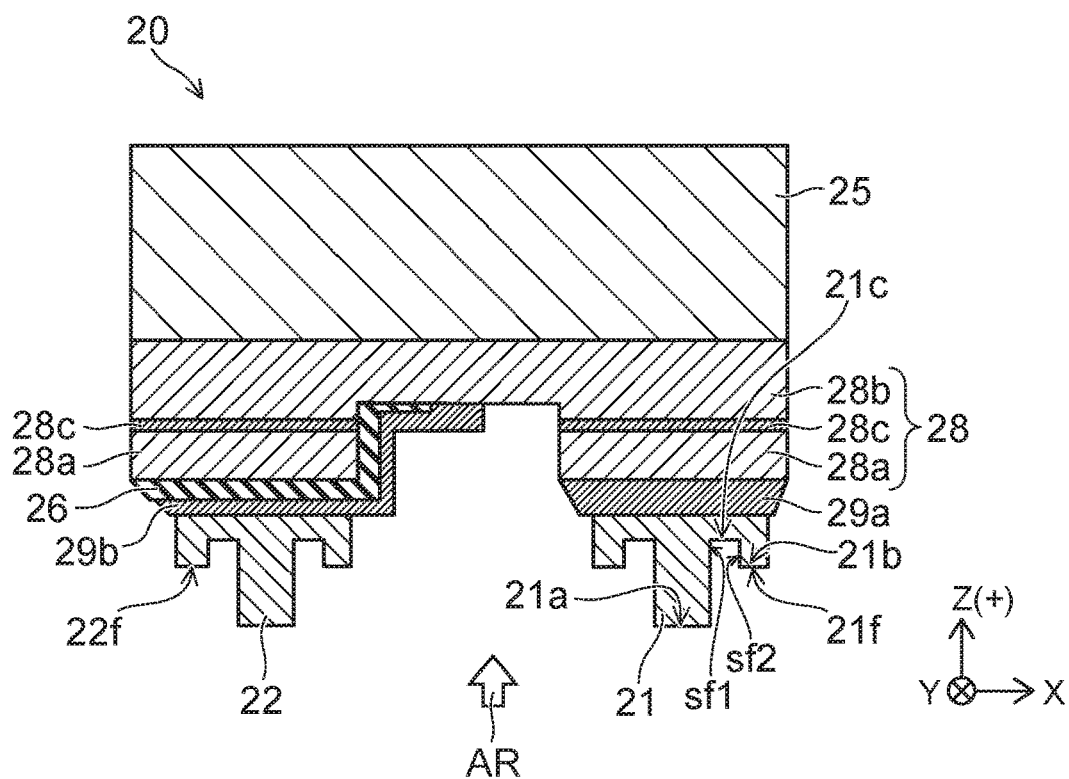
FIG. 2 is a schematic cross sectional view illustrating a light emitting element according to the first embodiment.
Figure 3:
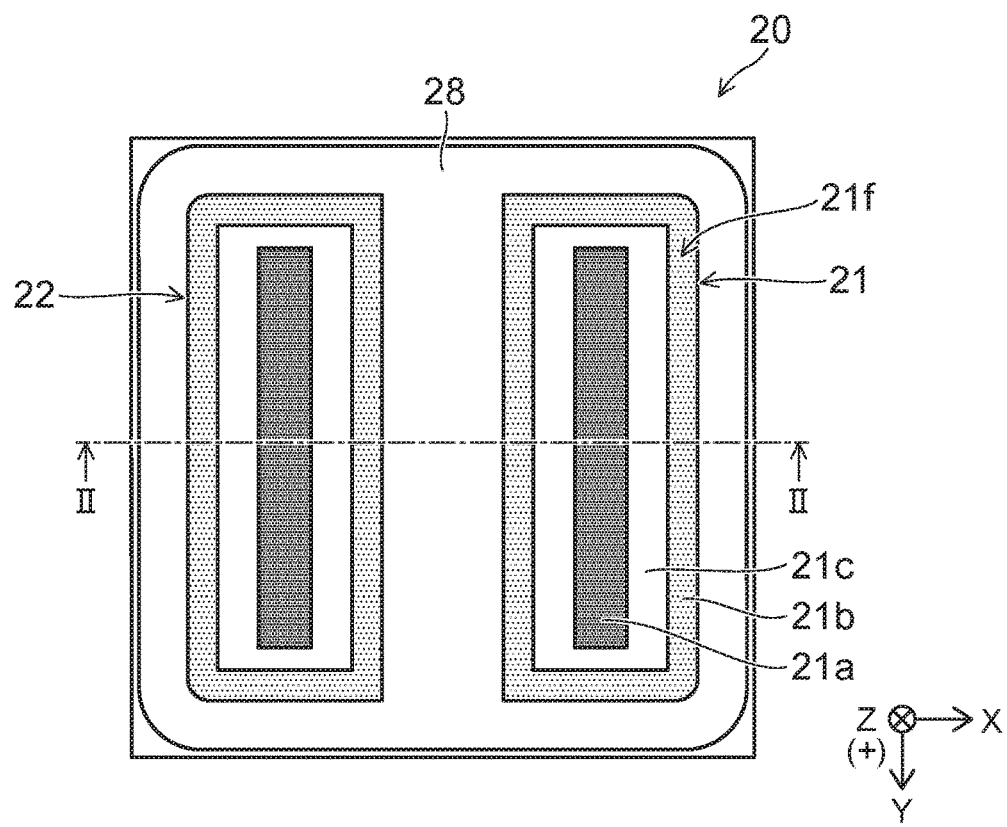
FIG. 3 is a schematic plan view illustrating the light emitting element according to the first embodiment.

FIG. 2 and FIG. 3 are schematic views illustrating the light emitting element according to the first embodiment.

FIG. 2 is a cross sectional view along II-II line of FIG. 3. FIG. 3 is a plan view viewed in an arrow AR direction of FIG. 2.

As shown in FIG. 2, the semiconductor stacked body 28 includes, for example, a p-type semiconductor layer 28a, an n-type semiconductor layer 28b, and a light emitting layer 28c located between them. These semiconductor layers spread in parallel, for example, to an X-Y plane. The p-type semiconductor layer 28b is located between the first electrode 21 and the n-type semiconductor layer 28b in the light emitting element 20 shown in FIG. 2. The first electrode 21 is electrically connected to the p-type semiconductor layer 28a via the first pad electrode 29a. The second electrode 22 is electrically connected to the n-type semiconductor layer 28b via the second pad electrode 29b. The first electrode 21 may be electrically connected to the p-type semiconductor layer 28a in direct contact, and the second electrode 22 may be electrically connected to the n-type semiconductor layer 28b in direct contact.

The light emitting element 20 shown in FIG. 2 includes a substrate 25. The semiconductor stacked body 28 is located between the substrate 25 and the first pad electrode 29a in the Z-axis direction. The semiconductor stacked body 28 is located between the substrate 25 and the second pad electrode 29b in the Z-axis direction. The substrate 25 is, for example, a sapphire substrate. The light emitting element 20 shown in FIG. 2 includes an insulating layer 26 between the p-type semiconductor layer 28a and the second pad electrode 29b. The insulating layer 26 includes, for example, silicon dioxide.

As described previously, an unevenness is provided on the lower surface 21f of the first electrode 21. The unevenness may be also provided on a lower surface 22f of the second electrode 22. The configuration of the second electrode 22 may be the same as the configuration of the first electrode 21. Hereinafter, the first electrode 21 will be described. The following description can also be applied to the second electrode 22.

The lower surface 21f of the first electrode 21 is a surface opposite to the upper surface (a surface facing the semiconductor stacked body 28). The lower surface 21f includes a first protrusion 21a, a second protrusion 21b, and a first depression 21c. The first depression 21c is located between the first protrusion 21a and the second protrusion 21b. A height of the first protrusion 21a is higher than a height of the second protrusion 21b.

As shown in FIG. 3, the second protrusion 21b is provided, for example, around the first protrusion 21a in bottom view. In this example, the second protrusion 21b surrounds the first protrusion 21a in bottom view.

Such the first electrode 21 and the first lead 11 are connected by the first bonding member 31. Hereinafter, an example of connection state of the first electrode 21 and the first lead 11 will be described.

Figure 4:
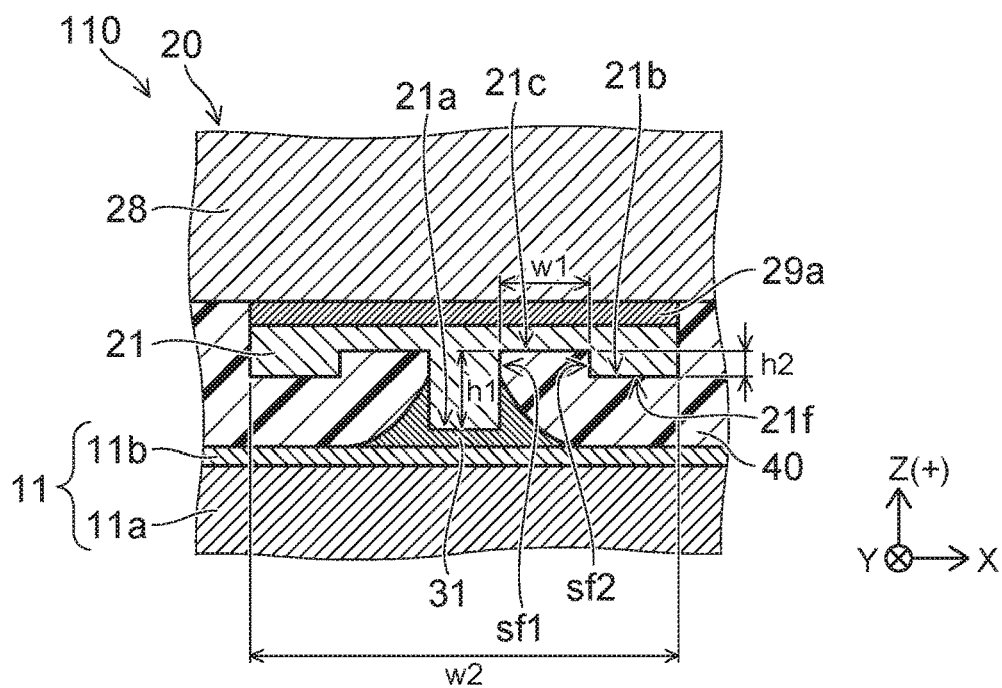
FIG. 4 is a schematic plan view illustrating a part of the light emitting device according to the first embodiment.

FIG. 4 is a schematic cross sectional view illustrating a part of the light emitting device according to the first embodiment.

As described previously, the height (a first height h1) of the first protrusion 21a is higher than the height (a second height h2) of the second protrusion 21b. The first height h1 is a length along the Z-axis direction between a bottom of the first depression 21c and a top of the first protrusion 21a. The second height h2 is a length along the Z-axis direction between the bottom of the first depression 21c and a top of the second protrusion 21b.

The first protrusion 21a has a first side surface sf1. The second protrusion 21b has a second side surface sf2. The second side surface sf2 faces the first side surface sf1. These side surfaces cross the X-Y plane.

A low protrusion is provided around the first protrusion 21a with a high height, and another low protrusion may be further provided around it. The above low protrusion and the above other protrusion can be regarded as multiple low protrusions. The second protrusion 21b may be a protrusion closest to the first protrusion 21a of the multiple low protrusions (the above low protrusion and the above other low protrusion etc.). That is, the other protrusion is not provided between the first side surface sf1 and the second side surface sf2. The side surface sf1 is directly continuous to the first depression 21c and the second side surface sf2 is directly continuous to the first depression 21c.

The first bonding member 31 contacts at least a part of the first side surface sf1. On the other hand, the second side surface sf2 is separated from the first bonding member 31. For example, the first bonding member 31 contacts the first side surface sf1 and does not contact the first depression 21c and the second protrusion 21b. In the embodiment, at least a part of the second side surface sf2 may be separated from the first bonding member 31. In other words, at least a part of the second side surface sf2 may contact the first bonding member 31. At least a part of the first depression 21c may be exposed from the first bonding member 31. When the sealing member 40 is provided, the sealing member 40 contacts at least a part of the second side surface sf2. The sealing member 40 may contact at least a part of the first depression 21c.

For example, the electrode and the lead part are connected by the bonding member 30, heating is performed to a temperature at which the bonding member 30 becomes liquid (for example, melting temperature), and thereafter cooling is performed. At this time, a stress is applied between the lead part and the semiconductor stacked body 28 by a difference of a linear expansion coefficient between the lead part and the semiconductor stacked body 28. Thereby, a gap may be produced between the first electrode 21 and the pad electrode and between the second electrode 22 and the pad electrode, or between the pad electrode and the semiconductor stacked body 28. Furthermore, when the lead includes silver etc., silver etc. can easily arrive at the above gap by migration via the electrode or the boding member 30. If silver etc. enters into the above gap, the above gap increases in size due to entering of silver, for example, and electrical discontinuity possibly occurs or a resistance in the light emitting element 20 possibly increases. As a result, the reliability of the light emitting device is degraded.

In the embodiment, the bonding member 30 (the first bonding member 31) does not contact the whole of the lower surface 21f of the first electrode 21, but contacts a part (the first side surface sf12) of the lower surface 21f. For this reason, for example, even if a stress is generated between the first electrode 21 and the semiconductor stacked body 28, the stress is relaxed. The stress between the first electrode 21 and the semiconductor staked body 28 can be small. Thereby, occurrence of the gap due to the stress can be suppressed between the first electrode 21 and the pad electrode and between the second electrode 22 and the pad electrode, or between the pad electrode and the semiconductor stacked body 28. Furthermore, the second protrusion 21b is provided in addition to the first protrusion 21a. A creepage distance increases, and silver etc. can be suppressed from exceeding the second protrusion 21b and arriving at the above gap. According to the embodiment, the light emitting device with improved reliability can be provided.

In the embodiment, the unevenness (the first protrusion 21a, the second protrusion 21b, and the first depression 21c) is provided on the lower surface of the electrode. The bonding member 30 (the first bonding member 31) contacts at least a part of the first side surface sf1 of the first protrusion 21a, and at least a part of the second side surface sf2 of the second protrusion 21b is separated from the first bonding member 31. The first bonding member 31 contacts only a part of the lower surface 21f of the first electrode 21, and does not contact the whole of the lower surface 21f. Thereby, the stress can be small. Thereby, the gap can be suppressed from occurring.

Furthermore, the second protrusion 21b is provided around the first protrusion 21a, and thus, for example, even if migration of silver etc. occurs, silver etc. can be suppressed from arriving at the gap.

Furthermore, the first bonding member 31 can be suppressed from spreading over the second protrusion 21b by the second protrusion 21b. Thereby, short circuit of the first electrode 21 and the second electrode 22 can also be suppressed.

According to the embodiment, the light emitting device and the light emitting element with improved reliability can be provided.

A width w1 (see FIG. 4) of the first depression 21c is relatively large. The width w1 is a width of the first depression 21c which is aligned with the direction (for example, the X-axis direction in FIG. 4) from the first protrusion 21a toward the second protrusion 21b. The width w1 is, for example, not less than 5 μm and not more than 50 μm.

For example, the width w1 is not less than 0.1 times and not more than 1.25 times of the first height h1 of the first protrusion 21a. In one example, the width w1 is about 40 μm, and the first height h1 is approximately 40 μm to 50 μm. If the width w1 is less than 0.1 times of the first height h1, for example, when the liquid-like first bonding member 31 contacts the first side surface sf1 of the first protrusion 21a, the liquid-like first bonding member 31 approaches excessively the second protrusion 21b via the first depression 21c. Considering a surface tension of the liquid-like first bonding member 31, if the width h1 is not less than 0.1 times of the first height h1, the first bonding member 31 can be suppressed from approaching the second protrusion 21b.

On the other hand, a width w2 (see FIG. 4) of the first electrode 21 is, for example, not less than 100 μm and not more than 300 μm. The width w2 is a width of the first electrode 21 which is aligned with the direction (for example, the X-axis direction in FIG. 4) from the first protrusion 21a toward the second protrusion 21b. Also in the case where the width w2 of the first electrode 21 is large like this, in the embodiment, occurrence of the gap can be suppressed by separating the first bonding member 31 from the second side surface sf2 of the second protrusion 21b. As a result, silver can also be suppressed from entering the gap.

The first height h1 is, for example, preferably not more than ⅓ of the width w2. If the first height h1 is not more than ⅓ of the width w2, for example, the electrical resistance of the first protrusion 21a can be low. Furthermore, strength of the first protrusion 21a can be suppressed from decreasing.

As shown in FIG. 4, the first lead 11 may include, for example, a first layer 11a and a second layer 11b. The second layer 11b is located between the light emitting element 20 and the first layer 11a. The second layer 11b functions, for example, as a light reflection film. For example, a reflection coefficient of the second layer 11b is higher than a reflection coefficient of the first layer 11a.

Hereinafter, examples of materials of respective members included in the light emitting device 110 will be described.

The first layer 11a of the lead includes, for example, at least one selected from the group consisting of copper, aluminum, gold, silver, tungsten, iron, nickel, cobalt, and molybdenum. The second layer 11b includes, for example, at least one selected from the group consisted of silver, aluminum, nickel, palladium, and rhodium. In particular, according to the light emitting device 110 of the embodiment, even if in the case where the second layer 11b is silver, the possibility that silver arrives at the gap etc. between the semiconductor stacked body 28 and the first pad electrode 29a can be reduced in the case of occurrence of silver migration.

The insulating part 15 includes, for example, a thermosetting resin (for example, epoxy resin, modified epoxy resin, silicone resin, or modified silicone resin etc.). The insulating part 15 may include a thermoplastic resin (for example, polyphthalamide resin, liquid crystal polymer, polybutylene terephthalate, or unsaturated polyester).

The electrodes (the first electrode 21 and the second electrode 22) include, for example, a metal (for example, copper etc.). The pad electrode includes, for example, at least one of gold, titanium, aluminum, rhodium, nickel and platinum, and for example, may be a stacked body having titanium, platinum and gold stacked in this order.

The semiconductor stacked body 28 includes, for example, nitride semiconductor. The nitride semiconductor includes, for example, $In_xAl_yGa_{1-x-y}N$ ($0 \leq Y$, $X+Y \leq 1$).

The bonding member 30 includes, for example, a solder (tin-bismuth-based, tin-copper-based, tin-silver-based, or gold-tin-based etc.). The bonding member 30 may include a brazing filler material (low melting point metal etc.).

The sealing member 40 includes, for example, a resin (silicone resin or epoxy resin etc.).

As shown in FIG. 3, the first protrusion 21a and/or the second protrusion 21b are, for example, linear in bottom view. For example, a length of the first protrusion 21a along the extending direction (in this example, the Y-axis direction) of the first protrusion 21a is longer than a length (width) of the first protrusion 21a along the direction (the X-axis direction) orthogonal to the extending direction.

Attention is paid to a part of the second protrusion 21b. A length of the part of the second protrusion 21b along the extending direction (for example, the Y-axis direction) of the part of the second protrusion 21b is longer than a length (width) of the part of the second protrusion 21b along the direction orthogonal to the extending direction.

Second Embodiment

The second embodiment relates to a method for manufacturing the light emitting element 20. Hereinafter, an example of the method for manufacturing the electrode of the light emitting element will be described.

FIG. 5A to FIG. 5D are schematic cross sectional views illustrating the method for manufacturing the light emitting element according to the second embodiment.

A downward direction in this drawing is the +Z direction. Therefore, "an upward direction" in FIG. 5A to FIG. 5D corresponds to "the downward direction" in FIG. 2.

Figure 5A:
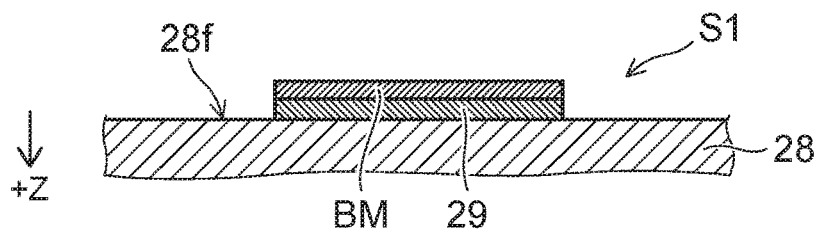
FIG. 5A is a schematic cross sectional view illustrating a method for manufacturing a light emitting element of a second embodiment.

As shown in FIG. 5A, a first structure body S1 is prepared (practice of preparing). The first structure body S1 includes the semiconductor stacked body 28 and a base metal part BM below a lower surface 28f of the semiconductor stacked body 28. The lower surface 28f is a surface on an upper side of the semiconductor stacked body 28 in FIG. 5A. In this example, the pad electrode 29 is provided between the semiconductor stacked body 28 and the base metal part BM.

Figure 5B:
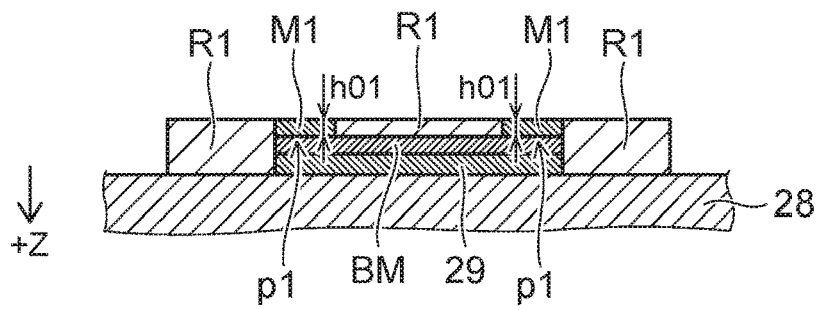
FIG. 5B is a schematic cross sectional view illustrating a method for manufacturing the light emitting element of the second embodiment.

As shown in FIG. 5B, a first metal part M1 is formed (forming a first metal part). In this forming, firstly, a first resist R1 is formed on the base metal part BM. For example, after providing a mask on an upper surface of a first portion p1 of the base metal part BM, the first resist R1 is disposed so as to cover the upper surface of the base metal part BM. Thereby, the upper surface of the first portion p1 is exposed from the first resist R1. For example, the first resist R1 covers the base metal part BM. The first metal part M1 is formed on the first portion p1. The first metal part M1 can be formed, for example, by plating. The first metal part M1 has a first height h01. The first height h01 is a length along the Z-axis direction of the first metal part M1.

Figure 5C:
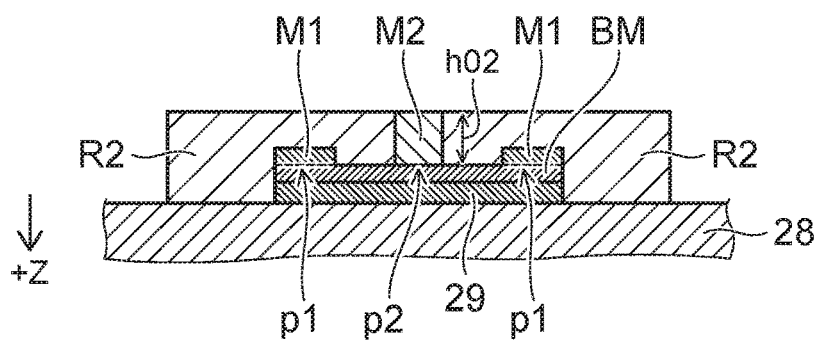
FIG. 5C is a schematic cross sectional view illustrating a method for manufacturing the light emitting element of the second embodiment.

As shown in FIG. 5C, a second metal part M2 is formed (forming a second metal part). In this forming, firstly, the first resist R1 is removed, and a second resist R2 is formed on the base metal part BM. For example, after providing a mask on an upper surface of a second portion p2 of the base metal part BM, the second resist R2 is disposed so as to cover the upper surface of the first metal part M1. The second portion p2 is separated from the first portion p1. For example, the second resist R2 covers a side surface of the base metal part BM. The second metal part M2 is formed on the second portion p2. The second metal part M2 can be formed, for example, by plating. The second metal part M2 has a second height H02. The second height h02 is higher than the first height h01. The second height h02 is a length along the Z-axis direction of the second metal part M2. The second resist R2 may be provided on the first resist R1 by stacking. Specifically, in FIG. 5B, a region corresponding to the second portion p2 of the first resist R1 of the base metal part BM is removed. Thereafter, a mask is provided on the second portion p2, and the second resist R2 is stacked on the first resist R1. Thereafter, for example, the second metal part M2 can be formed by stacking plating on the second portion p2 similarly to the example shown in FIG. 5C.

Figure 5D:
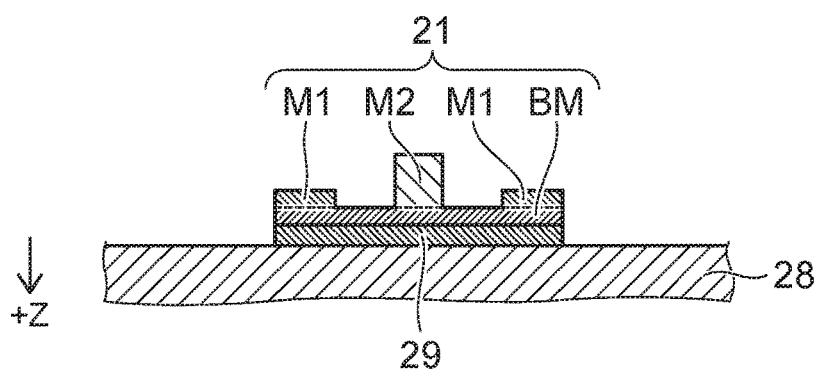
FIG. 5D is a schematic cross sectional view illustrating a method for manufacturing the light emitting element of the second embodiment.

As shown in FIG. 5D, the second resist R2 is removed. Thereby, the first electrode 21 is formed from the base metal part BM, the first metal part M1, and the second metal part M2. The first metal part M1 corresponds to the second protrusion 21b. The second metal part M2 corresponds to the first protrusion 21a.

Hereinafter, another example of the method for manufacturing the electrode of the light emitting element 20 will be described.

FIG. 6A to FIG. 6D are schematic cross sectional views illustrating a method for manufacturing another light emitting element according to the second embodiment.

A downward direction in these drawings are the +Z direction. Therefore, "an upward direction" in FIG. 6A to FIG. 6D correspond to "the downward direction" in FIG. 2. In the following, descriptions similar to the manufacturing method described in respect to FIG. 5A to FIG. 5D are omitted.

Figure 6A:
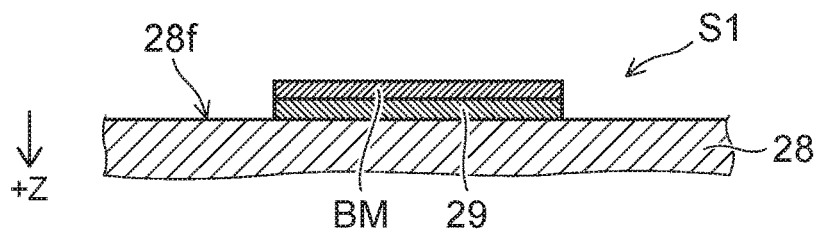
FIG. 6A is a schematic cross sectional view illustrating a method for manufacturing another light emitting element according to the second embodiment.

As shown in FIG. 6A, also in this case, the first structure body S1 is prepared (preparing).

Figure 6B:
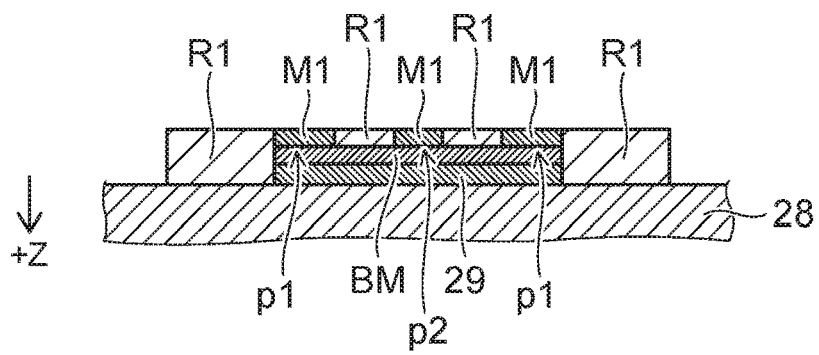
FIG. 6B is a schematic cross sectional view illustrating a method for manufacturing the other light emitting element according to the second embodiment.

As shown in FIG. 6B, the first metal part M1 is formed (forming the first metal part). In this forming, firstly, the first resist R1 is formed on the base metal part BM (forming the first metal part). For example, after providing a mask on the upper surface of the first portion p1 and the second portion p2 of the based metal part BM, the first resist R1 is disposed so as to cover the upper surface of the base metal part BM. Thereby, the upper surface of the first portion p1 and the second portion p2 is exposed from the first resist R1. The second portion p2 is separated from the first portion p1. For example, the first portion p1 is provided around the second portion p2 in bottom view. For example, the first resist R1 covers the side surface of the base metal part BM. The first metal part M1 is formed on the first portion p1 and the second portion p2. The first metal part M1 can be formed, for example, by plating.

Figure 6C:
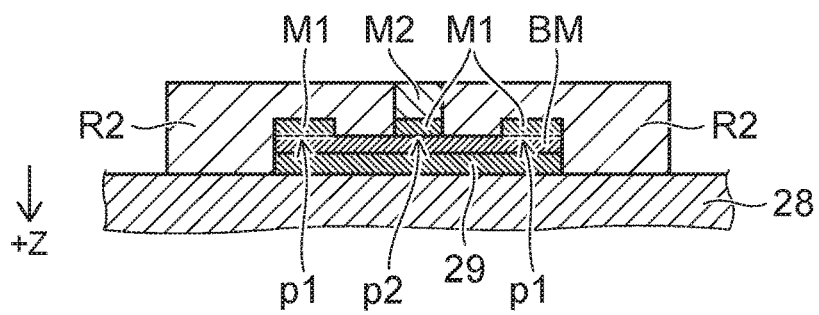
FIG. 6C is a schematic cross sectional view illustrating a method for manufacturing the other light emitting element according to the second embodiment.

As shown in FIG. 6C, the second metal part M2 is formed (forming the second metal part). In this forming, firstly, after removing the first resist R1, the second resist R2 is formed on the base metal part BM. While the second resist R2 covers a part of the first metal part M1 formed on the first portion p1, the second resist R2 exposes another part of the first metal part M1 formed on the second portion p2. The second metal part M2 is formed on another part described above of the first metal part M1 formed on the second portion p2. The second metal part M2 can be formed, for example, by plating. The second resist R2 may be provided on the first resist R1 by stacking similar to the embodiment of FIG. 5A to FIG. 5D.

Figure 6D:
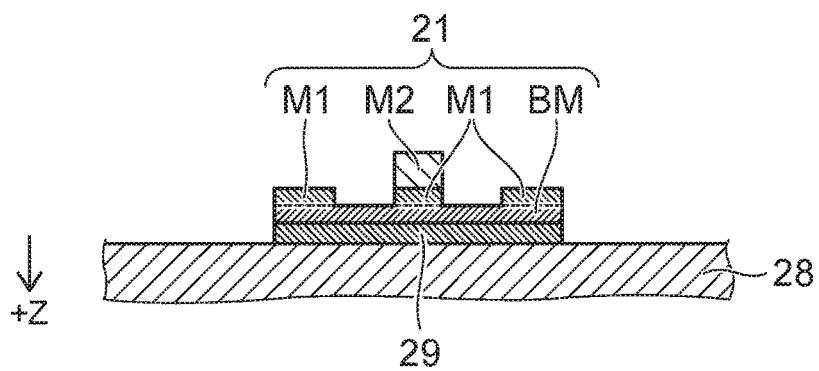
FIG. 6D is a schematic cross sectional view illustrating a method for manufacturing the other light emitting element according to the second embodiment.

As shown in FIG. 6D, the second resist R2 is removed. The first electrode 21 is obtained from the base metal part BM, the first metal part M1, and the second metal part M2. In this method, a part of the first metal part M1 formed on the first portion p1 corresponds to the second protrusion 21b. On the other hand, another part of the first metal part M1 formed on the portion p2 and the second metal part M2 form the first protrusion 21a.

Materials of the base metal part BM, the first metal part M1, and the second metal part M2 can include, for example, the same material as the material (described above) of the electrode.

According to the method for manufacturing the light emitting element of the embodiment, the light emitting element which can improve the reliability can be manufactured.

Hereinafter, some other examples of the first embodiment will be described. In the following description, descriptions similar to the configurations already described are omitted.

Figure 7:
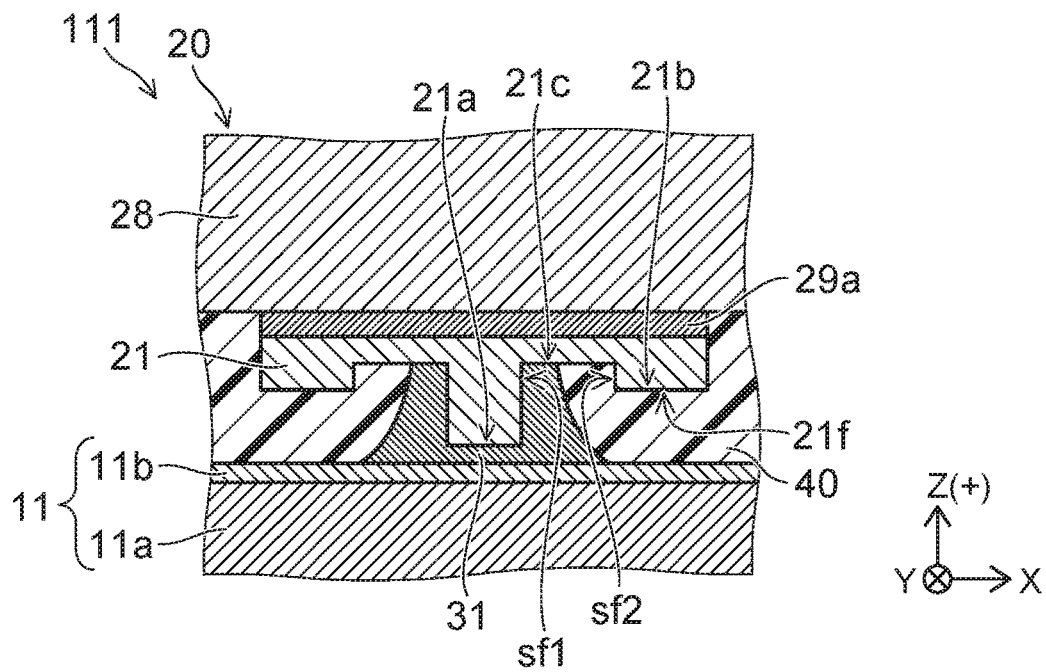
FIG. 7 is a schematic cross sectional view illustrating a part of another light emitting device according to the first embodiment.

FIG. 7 is a schematic cross sectional view illustrating a part of another light emitting device according to the first embodiment.

As shown in FIG. 7, the first bonding member 31 of another light emitting device 111 according to the embodiment contacts the first side surface sf1, and a part of the first depression 21c, and does not contact the second protrusion 21b. Also in the light emitting device 111, a crack can be suppressed. Silver etc. can be suppressed from entering into the crack. The light emitting device with improved reliability can be provided.

Figure 8:
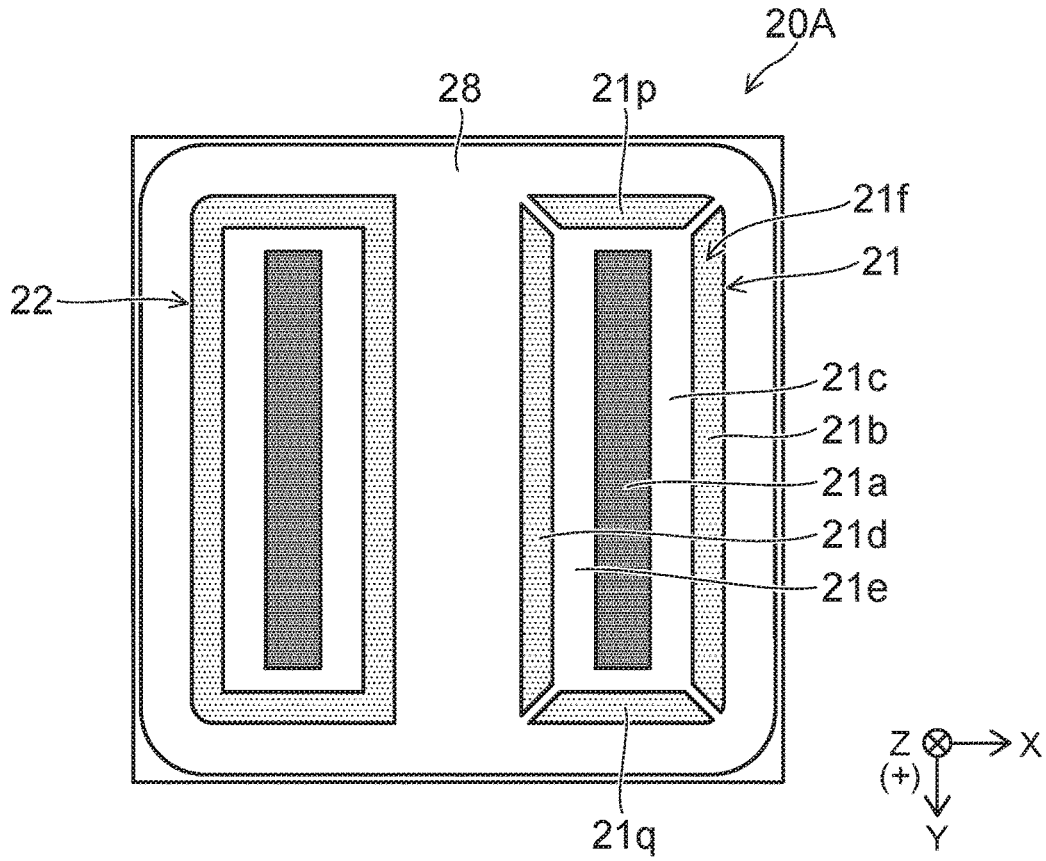
FIG. 8 is a schematic plan view illustrating a part of another light emitting element according to the first embodiment.

FIG. 8 is a schematic plan view illustrating another light emitting element according to the first embodiment.

As shown in FIG. 8, another light emitting element 20A according to the embodiment also includes the semiconductor stacked body 28, the first electrode 21 and the second electrode 22. In this example, the lower surface 21f of the first electrode 21 further includes a third protrusion 21d, and a second depression 21e in addition to the first protrusion 21a, the second protrusion 21b, and the first depression 21c. The second depression 21e is located between the first protrusion 21a and the third protrusion 21d. The second depression 21e may be continuous to the first depression 21c. In this example, a part of the first protrusion 21a is located between the third protrusion 21d and the second protrusion 21b. As described later, a height of the third protrusion 21d is lower than the height (the first height h1) of the first protrusion 21a. The height of the second protrusion 21b and the height of the third protrusion 21d may be the same or may be different. The height of the third protrusion 21d can be higher than the height of the second protrusion 21b. Thereby, the height of the third protrusion 21d on the second electrode 22 side is made high, and thus, for example, possibility that the bonding member bonding to the first electrode 21 arrives at the second electrode 22 can be reduced.

In this example, a direction from the third protrusion 21d toward the second protrusion 21b is aligned with the Z-axis direction. In the X-axis direction, the first protrusion 21a is located between the third protrusion 21d and the second protrusion 21b. In this example, a protrusion 21p and a protrusion 21q are further provided. In the Y-axis direction, the first protrusion 21a is located between the protrusion 21p and the protrusion 21q. For example, respective heights of the protrusion 21p and the protrusion 21q are lower than the first height h1. In this example, the second protrusion 21b, the third protrusion 21d, the protrusion 21p and the protrusion 21q are mutually separated. In the embodiment, the third protrusion 21d, the protrusion 21p and the protrusion 21q may be continuous to the second protrusion 21b.

The first protrusion 21a and/or the second protrusion 21b are, for example, linear in bottom view. For example, a length of the first protrusion 21a along the extending direction of the first protrusion 21a (in this example, the Y-axis direction) is longer than a length (width) of the first protrusion 21a along the direction (the X-axis direction) orthogonal to the extending direction. A length of the second protrusion 21b along the extending direction of the second protrusion 21b (in this example, the Y-axis direction) is longer than a length (width) of a part of the second protrusion 21b along the direction (the X-axis direction) orthogonal to the extending direction.

Figure 9:
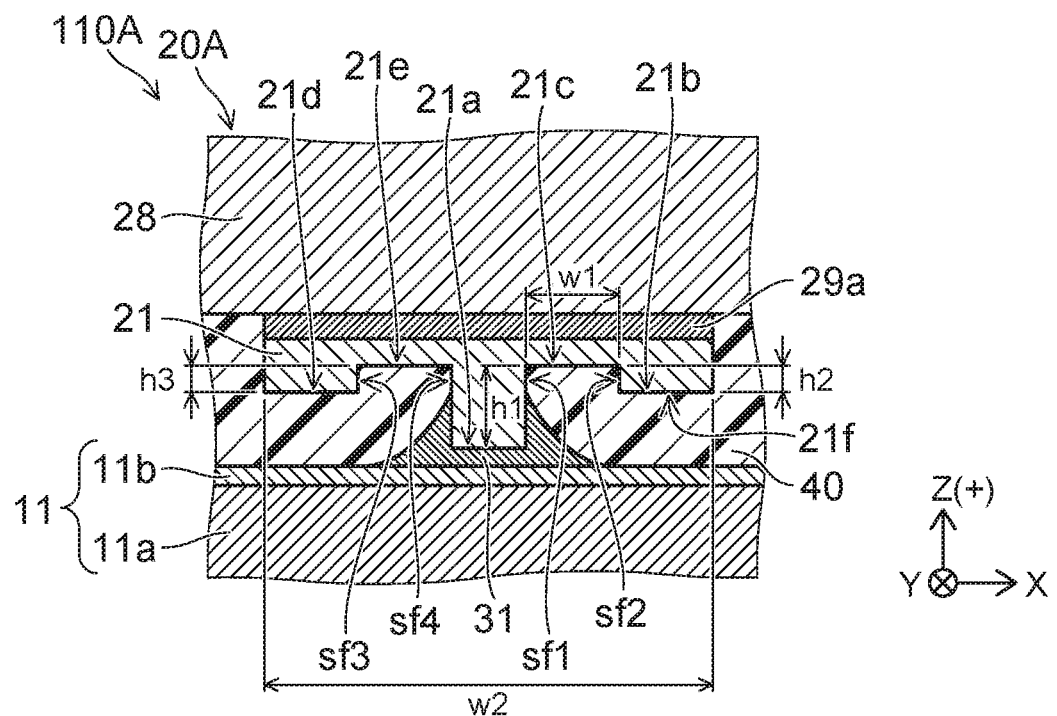
FIG. 9 is a schematic cross sectional view illustrating a part of another light emitting device according to the first embodiment.

FIG. 9 is a schematic cross sectional view illustrating a part of another light emitting device according to the first embodiment.

As shown in FIG. 9, a light emitting device 110A according to the embodiment includes the first lead 11, the light emitting element 20A, and the first bonding member 31. As described already, the light emitting element 20A further includes the third protrusion 21d, and the second depression 21e in addition to the first protrusion 21a, the second protrusion 21b, and the first depression 21c. As shown in FIG. 9, the first height h1 of the first protrusion 21a is higher than a third height h3 of the third protrusion 21d. The third height h3 is a length along the Z-axis direction of a third side surface sf3.

The third protrusion 21d has the third side surface sf3. The first protrusion 21a has a fourth side surface sf4. The first side surface sf1 is located between the fourth side surface sf4 and the second side surface sf2. The third side surface sf3 faces the fourth side surface sf4. The first bonding member 31 contacts at least a part of the fourth side surface sf4. At least a part of the third side surface sf3 is separated from the first bonding member 31.

Also in the light emitting device 110A, a crack can be suppressed. Silver etc. can be suppressed from entering into the crack. The light emitting device with improved reliability can be provided.

Figure 10:
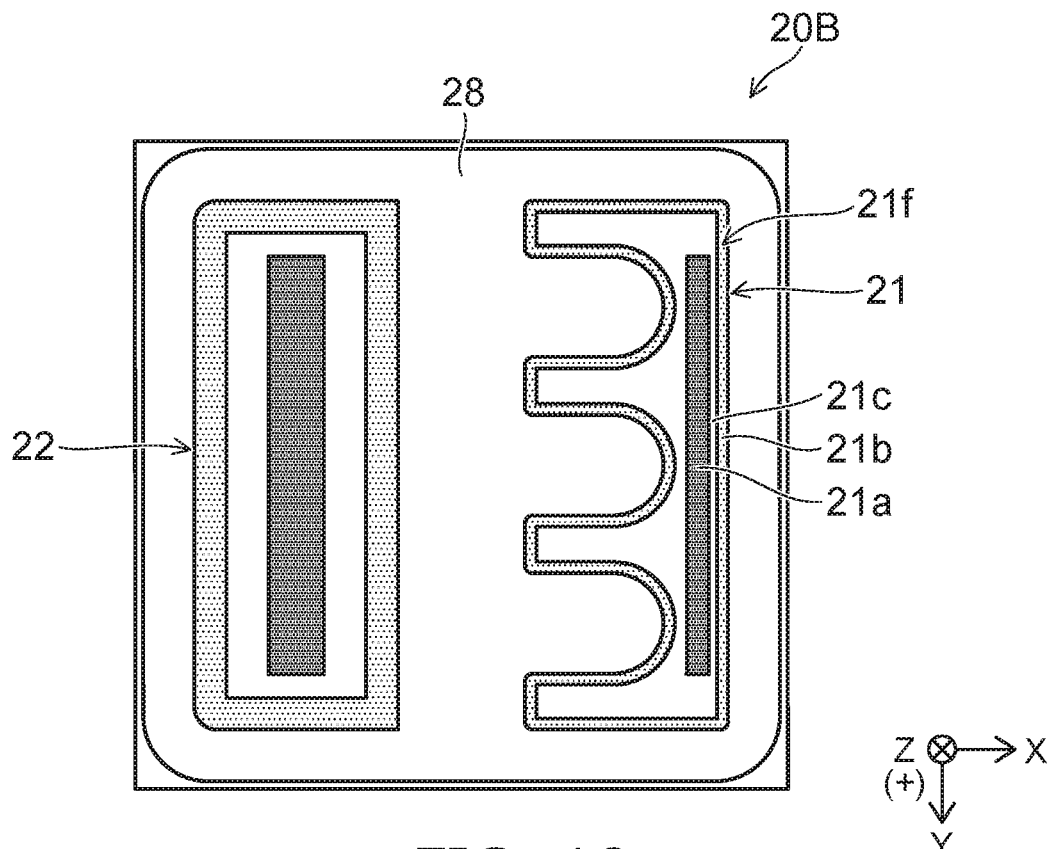
FIG. 10 is a schematic plan view illustrating a part of another light emitting element according to the first embodiment.

FIG. 10 is a schematic plan view illustrating another light emitting element according to the first embodiment.

As shown in FIG. 10, another light emitting element 20B according to the embodiment also includes the semiconductor stacked body 28, the first electrode 21, and the second electrode 22. The lower surface 21f of the first electrode 21 includes the first protrusion 21a, the second protrusion 21b, and the first depression 21c. A part of the second protrusion 21b is curved in bottom view.

Figure 11:
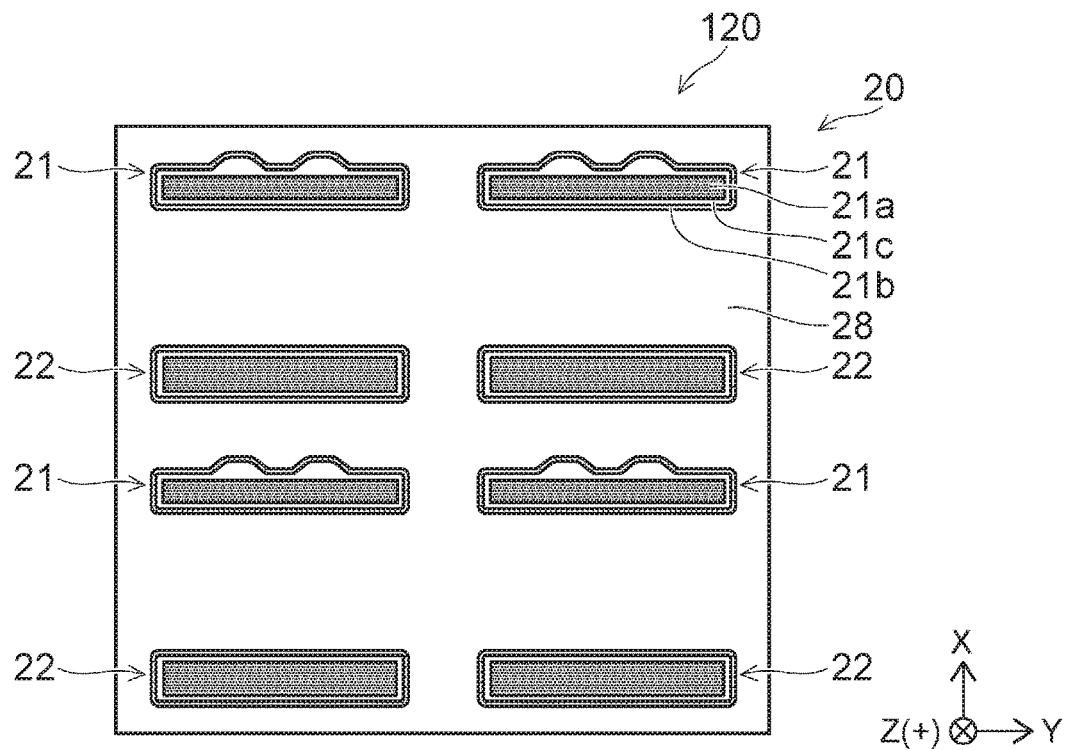
FIG. 11 is a schematic cross sectional view illustrating a part of another light emitting device according to the first embodiment.
Figure 12:
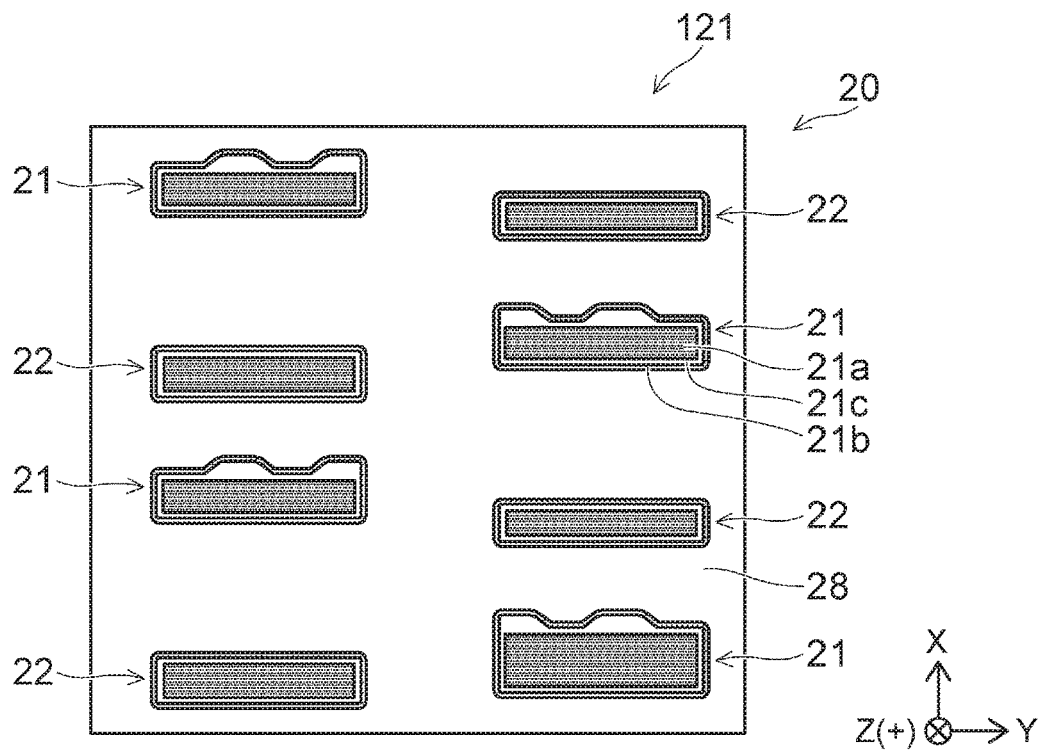
FIG. 12 is a schematic cross sectional view illustrating a part of another light emitting device according to the first embodiment.

FIG. 11 and FIG. 12 are schematic plan views illustrating other light emitting devices according to the first embodiment.

As shown in FIG. 11 and FIG. 12, light emitting devices 120 and 121 according to the embodiment include the light emitting element 20 including the semiconductor stacked body 28, the first electrode 21, and the second electrode 22.

As shown in FIG. 11 and FIG. 12, multiple first electrodes 21 and multiple second electrodes 22 are provided in the light emitting element 20 of the light emitting devices 120 and 121. At least one lower surface 21f of the multiple first electrodes 21 includes the first protrusion 21a, the second protrusion 21b, and the first depression 21c described above. At least one of the multiple second electrodes 22 may have unevenness similar to the first electrodes 21. The reliability can be improved also in the light emitting devices 120 and 121.

According to the embodiment, the light emitting device and the light emitting element with improved reliability and the method for manufacturing the light emitting element can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components such as light emitting elements, leads, memory cells, and bonding members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all light emitting devices, light emitting elements, and methods for manufacturing light emitting elements practicable by an appropriate design modification by one skilled in the art based on the light emitting devices, the light emitting elements, and the methods for manufacturing light emitting elements described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A light emitting device, comprising:
a first lead;
a light emitting element including a semiconductor stacked body and a first electrode, the semiconductor stacked body including a light emitting layer, the first electrode being below the semiconductor stacked body; and
a first bonding member electrically connecting the first lead and the first electrode,
a lower surface of the first electrode including a first protrusion, a second protrusion, and a first depression, the first depression being located between the first protrusion and the second protrusion,
a first height of the first protrusion being higher than a second height of the second protrusion,
the first protrusion having a first side surface,
the second protrusion having a second side surface facing the first side surface,
the first bonding member contacting at least a part of the first side surface, and
at least a part of the second side surface being separated from the first bonding member.

2. The light emitting device according to claim 1, further comprising:
a sealing member covering the light emitting element,
at least a part of the sealing member contacting at least a part of the second side surface.

3. The light emitting device according to claim 1, wherein
at least a part of the first depression is exposed from the first bonding member.

4. The light emitting device according to claim 1, wherein
a width of the first depression along a direction from the first protrusion toward the second protrusion is not less than 5 μm.

5. The light emitting device according to claim 1, wherein
the second protrusion surrounds the first protrusion in bottom view.

6. The light emitting device according to claim 1, wherein
the lower surface further includes a third protrusion and a second depression in sectional view, the second depression being located between the first protrusion and the third protrusion,
a part of the first protrusion is between the third protrusion and the second protrusion,
the first height of the first protrusion is higher than a third height of the third protrusion,
the third protrusion has a third side surface,
the first protrusion has a fourth side surface, and the first side surface is between the fourth side surface and the second side surface,
the third side surface faces the fourth side surface,
the first bonding member contacts at least a part of the fourth side surface, and
at least a part of the third side surface is separated from the first bonding member.

7. The light emitting device according to claim 1, wherein
the first lead includes a first layer, and
the first layer includes at least one selected from the group consisting of silver and aluminum.

8. A light emitting element, comprising:
a semiconductor stacked body including a light emitting layer; and
a first electrode below the semiconductor stacked body,
a lower surface of the first electrode including a first protrusion, a second protrusion, and a first depression, the first depression being located between the first protrusion and the second protrusion,
a first height of the first protrusion being higher than a second height of the second protrusion, and
a width of the first depression along a direction from the first protrusion toward the second protrusion being not less than 5 µm.

9. The light emitting element according to claim 8, wherein
a width of the first electrode along the direction from the first protrusion toward the second protrusion is not less than 100 µm.

10. The light emitting element according to claim 8, wherein
the first electrode further includes a third protrusion,
a part of the first protrusion is between the second protrusion and the third protrusion, and
the first height is higher than a third height of the third protrusion with reference to the first depression.

11. The light emitting element according to claim 8, wherein
the first protrusion and/or the second protrusion are linear in bottom view.

12. The light emitting element according to claim 8, wherein
the second protrusion surrounds the first protrusion.

13. A method for manufacturing a light emitting element, comprising:
preparing a first structure body including a semiconductor stacked body and a base metal part, the base metal part being on a lower surface of the semiconductor stacked body;
forming a first resist on the base metal part, the first resist exposing a first portion of the base metal part, and forming a first metal part on the first portion, the first metal part having a first height; and
forming a second resist on the base metal part, the second resist exposing a second portion located at a position separating from the first portion of the base metal part, and forming a second metal part on the second portion, the second metal part having a second height higher than the first height.

14. A method for manufacturing a light emitting element, comprising:
preparing a first structure body including a semiconductor stacked body and a base metal part, the base metal part being on a lower surface of the semiconductor stacked body;
forming a first resist on the base metal part, the first resist exposing a first portion of the base metal part and a second portion separating from the first portion, and forming a first metal part on the first portion and the second portion; and
forming a second resist on the base metal part, the second resist covering a part of the first metal part formed on the first portion and exposing another part of the first metal part formed on the second portion, and forming a second metal part on the other part of the first metal part formed on the second portion.

15. The method for manufacturing the light emitting element according to claim 13, wherein the first metal part and the second metal part are formed by plating.

16. The method for manufacturing the light emitting element according to claim 14, wherein the first metal part and the second metal part are formed by plating.

* * * * *